(12) United States Patent
Uchiyama

(10) Patent No.: US 6,931,700 B2
(45) Date of Patent: Aug. 23, 2005

(54) METHOD OF MANUFACTURING THIN FILM PIEZOELECTRIC ELEMENTS

(75) Inventor: Hirokazu Uchiyama, Higashiosaka (JP)

(73) Assignee: Matsushita Electric Industrial Co., Ltd. (JP)

(*) Notice: Subject to any disclaimer, the term of this patent is extended or adjusted under 35 U.S.C. 154(b) by 140 days.

(21) Appl. No.: 10/256,229

(22) Filed: Sep. 27, 2002

(65) Prior Publication Data

US 2003/0062804 A1 Apr. 3, 2003

(30) Foreign Application Priority Data

Oct. 2, 2001 (JP) .................................. 2001-306124

(51) Int. Cl.[7] .............................................. H04R 17/00
(52) U.S. Cl. ..................... 29/25.35; 29/846; 310/340; 310/348; 156/254; 156/275.5; 156/327; 427/100
(58) Field of Search .......................... 29/25.35, 841, 29/846, 827; 310/311, 340, 348; 264/483; 156/247, 254, 275.5, 327; 427/100

(56) References Cited

U.S. PATENT DOCUMENTS 5,166,570 A * 11/1992 Takahashi ............... 310/340 X
5,640,746 A * 6/1997 Knecht et al. ............. 29/25.35

FOREIGN PATENT DOCUMENTS

| JP | 59-98140 | * 6/1984 | ............ 264/483 X |
| JP | 60-180109 | 9/1985 | |
| JP | 02-003995 | 1/1990 | |
| JP | 04-170077 | 6/1992 | |
| JP | 5-335864 | * 12/1993 | ............ 29/25.35 |
| JP | 11-345833 | 12/1999 | |

OTHER PUBLICATIONS

Takeuchi et al., "Novel 1–3 Piezo–composites Using Synchrotron Radiation Lithography and Its Application for High frequency Medical Imaging Arrays", 1997 Ultrasonics Symposium, IEEE Proceedings, vol. 2, Oct. 5, 1997, pp. 919–922.*

* cited by examiner

Primary Examiner—A. Dexter Tugbang
(74) Attorney, Agent, or Firm—Parkhurst & Wendel, L.L.P.

(57) ABSTRACT

A method for making thin film piezoelectric elements including forming a flat-plate laminate by laminating a first electrode layer, a piezoelectric thin film, and a second electrode layer, on one surface of an element forming substrate, and forming on the one surface a plurality of thin film piezoelectric elements including connecting electrodes for electrically connecting the first electrode layer and the second electrode layer to external equipment, including forming the element holding layer including resin over the one surface of the substrate including the thin film piezoelectric elements; bonding the one surface of the substrate, opposed to a temporary fixing substrate and covered with the element holding layer, on the temporary fixing substrate by using a fixing resin; covering a peripheral area with a specified width; and removing the element forming substrate by etching in an area other than the area covered with the fixing resin, and separating the thin film piezoelectric elements held by the element holding layer, into individually separate elements or groups of elements.

6 Claims, 11 Drawing Sheets

METHOD OF MANUFACTURING THIN FILM PIEZOELECTRIC ELEMENTS

FIELD OF THE INVENTION

The present invention relates to a piezoelectric element used for fine positioning and as a piezoelectric sensor, and its manufacturing method, and an actuator unit using same.

BACKGROUND OF THE INVENTION

Recently, electro-mechanical elements such as micro-actuators are attracting attention. Such elements may realize very small and highly accurate component parts, and the productivity may be greatly improved by using a semiconductor process. Particularly, a micro-actuator using piezoelectric elements is now under development as a element for fine displacement of a scanning tunnel microscope and for fine positioning of a head slider of a magnetic disk recording and reproducing unit (hereinafter called a disk drive unit).

In a disk drive unit, a magnetic head for recording and reproducing information on a magnetic disk is mounted on a head slider and attached to an actuator arm. The actuator arm is driven by a voice coil motor (hereinafter called VCM) and positioned to the specified track position on the magnetic disk, thereby recording and reproducing information by the magnetic head. However, as the recording density is improved, it is now very difficult to assure sufficient accuracy in such a conventional method of positioning by VCM only. Accordingly, in addition to a positioning means by VCM, technical developments are now in progress to realize high-speed and highly accurate positioning by fine driving of a head slider with use of a fine positioning means using piezoelectric elements.

Including an actuator as mentioned above, piezoelectric elements are expected to be applied in various ways. To meet the expectation, piezoelectric elements are required to be small-sized, able to render low voltage drive possible and to generate considerable displacement, and a method of manufacturing thin film is now examined for the manufacture of such elements. In a thin film manufacturing method, piezoelectric elements are manufactured such that a piezoelectric thin film and electrode layer are first formed on a substrate such as a silicon mono-crystalline substrate and then processed for pattern forming, and finally, the piezoelectric element is separated from the substrate. However, since piezoelectric elements made by a thin film manufacturing method are very thin, after separating the piezoelectric elements from the substrate, it is very difficult to mount the piezoelectric elements on a mounting substrate without damaging them, and as a result, there arises a serious problem of productivity.

Taking the above matter into consideration, a manufacturing method in which pyroelectric elements and piezoelectric elements are mounted on a separately disposed electrode forming substrate with good mass-productivity is disclosed (Japanese Laid-open Patent No. H11-345833). In this disclosure, an element transfer jig is prepared, and elements formed on a temporary substrate are bonded in specified positions to the element transfer jig by using resin or double-sided adhesive tape, followed by selectively etching only the temporary substrate. Subsequently, the electrode disposed on the electrode forming substrate and the electrode of the element are bonded opposite to each other, for example by means of soldering. After that, the resin or adhesive tape used for bonding the element is dissolved and removed to separate the element from the element transfer jig, thereby forming pyroelectric elements or piezoelectric elements bonded in a specified shape on an electrode forming substrate.

However, in this method, the elements are individually separated by cutting them off every temporary substrate, and after that, they are bonded one by one onto the element transfer jig, and the temporary substrate is removed by etching. Therefore, when simultaneously bonding all the elements onto the electrode forming substrate, it is necessary to bond the elements onto the element transfer jig. However, since the elements are bonded one by one, it is relatively difficult to improve the accuracy.

Also, disclosed is a structure such that, after bonding pyroelectric thin film with organic thin film onto a substrate provided with an opening, the substrate with pyroelectric thin film formed thereon is removed by etching, thereby holding the pyroelectric thin film only by the organic thin film (Japanese Laid-open Patent No. H4-170077). In this method, after forming organic thin film so as to cover the pyroelectric thin film formed on a specified substrate, it is bonded onto a polyimide substrate provided with an opening. After that, the substrate with the pyroelectric thin film formed thereon is removed by etching, and at the opening portion, the pyroelectric thin film is held only by the organic thin film. Also in this manufacturing method, a substrate with pyroelectric thin film formed thereon is bonded onto a mounting substrate like a polyimide substrate, and after that, only the substrate is removed by etching. That is, since the substrate with pyroelectric thin film formed thereon is etched after mounting, the chemical solution or gas used for etching may cause the mounting substrate or the wiring electrode to change in quality or the shape of the mounting substrate is subjected to restrictions.

The present invention is intended to provide a thin film piezoelectric element and its manufacturing method, wherein the structure is such that thin film piezoelectric elements formed by a thin film manufacturing method are held by an element protective layer even after the element forming substrate is removed by etching, and that the mounting substrate is devised so as to prevent the element forming substrate from being exposed to the etching solution, and thereby, it is possible to improve the mass-productivity including the manufacturing process up to the mounting step and the reliability of the elements in a state of being mounted on a substrate.

SUMMARY OF THE INVENTION

The present invention has been made in order to solve the above problem. A manufacturing method for thin piezoelectric elements of the present invention comprises the steps of:

a) forming a flat-plate laminate formed by sequentially laminating a first electrode layer, a piezoelectric thin film, and a second electrode layer, or a two-layer laminate formed by laminating the second electrode layers of the laminate opposite to each other, on an element forming substrate, and forming a plurality of thin film piezoelectric elements, provided with connecting electrodes for electrically connecting the first electrode layer and the second electrode layer to external equipment, on one surface of the element forming substrate;

b) coating an element holding layer made up of resin over the one surface of the element forming substrate including the thin film piezoelectric elements, and removing the element forming substrate in the area where the thin film piezoelectric elements are formed, thereby holding the thin film piezoelectric elements by the element holding layer; and c) separating the thin film piezoelectric elements held by the element holding layer, individually or every specified unit.

Due to this manufacturing method, a plurality of thin film piezoelectric elements formed on an element forming substrate are held in initial positions by a peripheral frame and an element holding layer even after the element forming substrate is removed by etching. Accordingly, simultaneous forming of a protective resin layer and adhesive resin layer over a plurality of thin film piezoelectric elements all together, and their photolithography and etching can be easily performed. Also, when positioning and mounting thin film piezoelectric elements on a piezoelectric mounting substrate, it is possible to perform the mounting operation with good mass-productivity and high accuracy by means of an automatic mounting apparatus because the elements are arranged at a constant pitch.

Further, since the thin film piezoelectric elements formed in pairs are connected to each other by element protective layer, the accuracy and mass-productivity in mounting the elements on a mounting substrate can be improved. Also, since both surfaces of the area where the thin film piezoelectric element functions as a piezoelectric material are formed with an element holding layer and protective resin layer which are same in material and thickness, there will be no generation of warp or worsening of the piezoelectric characteristics. Further, they are protected by an element holding layer made up of resin and a protective resin layer, and therefore, it is possible to prevent corrosion of the thin film piezoelectric elements and generation of dust and to greatly improve the reliability in use as an actuator unit.

DETAILED DESCRIPTION OF THE INVENTION

The preferred embodiments of the present invention will be described in the following with reference to the drawings. Like numerals refer to like component parts throughout.

First Exemplary Embodiment

Figure 1A:
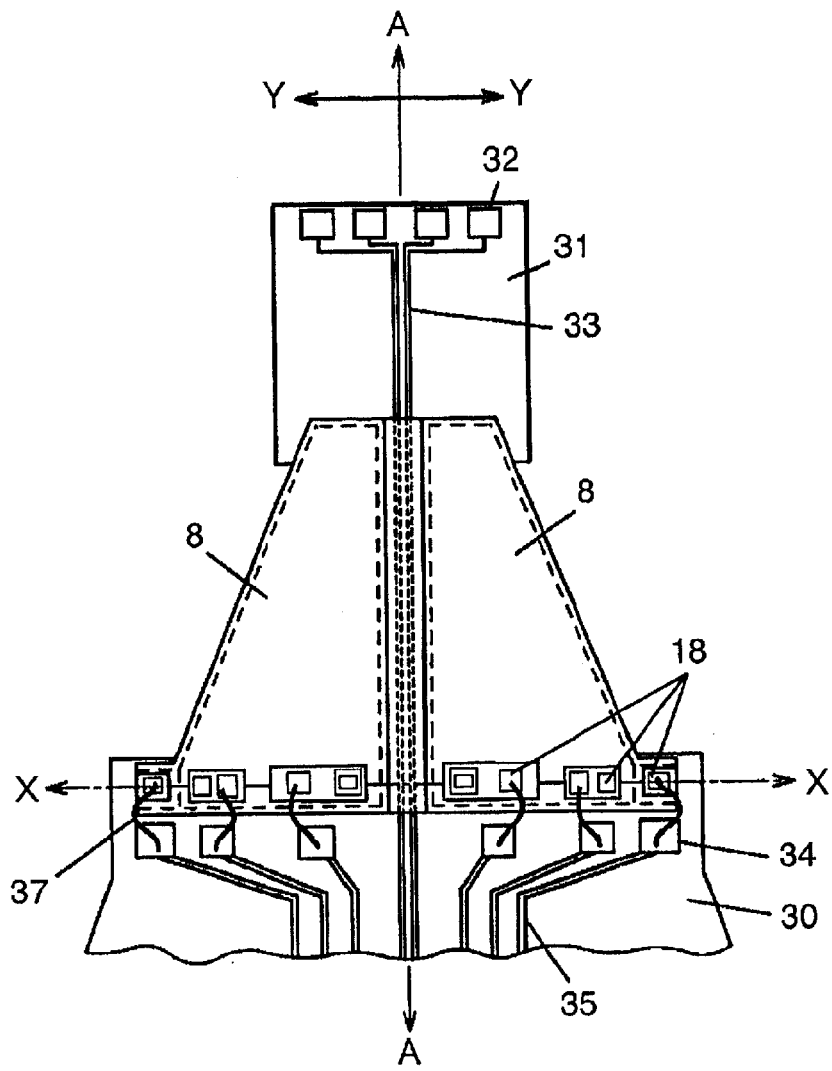
FIG. 1A is a plan view of a thin film piezoelectric element made by the manufacturing method in the first preferred embodiment of the present invention.
Figure 1B:
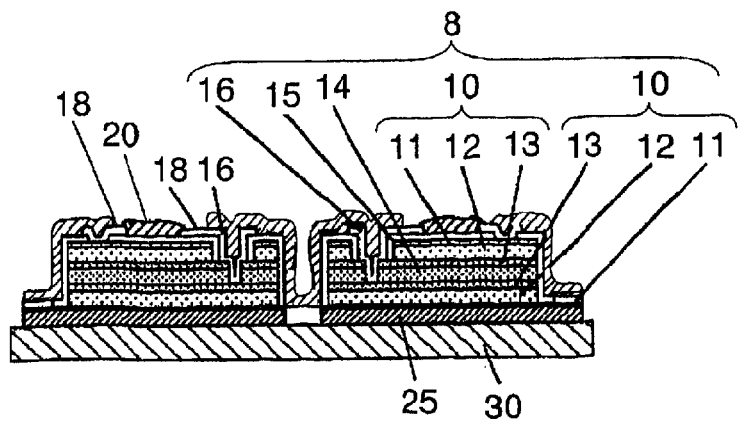
FIG. 1B is a sectional view along the X—X line shown in FIG. 1A.

FIG. 1A is a plan view of a thin film piezoelectric element portion in an actuator unit using thin film piezoelectric elements as a pair made by the manufacturing method in the first preferred embodiment. This actuator unit is used for highly accurate fine positioning of a head slider to a specified track position on a disk in a magnetic disk drive unit. Two pieces of thin film piezoelectric elements 8 are provided with a specified gap in the lengthwise direction and formed in symmetric relation to the A—A line, the center line of the gap, and are bonded on a flexure 30 that is a mounting substrate. FIG. 1B is a sectional view along the X—X line shown in FIG. 1A. The configuration will be described in the following by using these figures.

Each of the thin film piezoelectric elements 8 comprises a two-layer laminate integrated by bonding the second electrode layers 13 to each other with use of bonding layer 14 with respect to two laminates 10 formed of piezoelectric thin film 12 held between the first electrode layer 11 and the second electrode layer 13, including an insulating layer 15 and connecting electrode layer 16 processed into specified shapes. The thin film piezoelectric element 8 may further include an element holding layer and protective resin layer as described later.

Here, the first electrode layer 11 and the second electrode layer 13 are preferable to be platinum (Pt), and as the piezoelectric thin film 12, lead zirconate Titans (PZT) is preferable, but the present invention is not limited to these materials, and it is also preferable to use layer materials such as lead titanate and lead zirconate which have piezoelectricity. Also, regarding the first electrode layer 11 and the second electrode layer 13, it is also possible to use rare metals such as gold, rhodium and ruthenium or oxide conductors such as ruthenium oxide and the like.

As illustrated, the element holding layer 20 is formed not only on the surfaces of thin film piezoelectric elements 8 but also in their gaps. In this way, two thin film piezoelectric elements 8 are bonded and integrated. Thus, when the thin film piezoelectric elements 8 are bonded on the flexure 30 that is a mounting substrate, there will be no positional deflection between the thin film piezoelectric elements 8, and also the mounting workability may be greatly improved. Further, it is possible to improve the moisture resistance of the thin film piezoelectric elements 8 and to reduce the generation of dust.

Adhesive resin layer 25 is formed on the surface of the first electrode layer 11 where the connecting electrode 16 is not formed, and is bonded on the flexure 30. The flexure 30 is provided with piezoelectric electrode pad 34 at a position corresponding to the electrode pad 18 of the thin film piezoelectric element 8, and the piezoelectric electrode pad 34 and the electrode pad 18 are connected, for example, by using a wire lead 37.

The flexure 30 has a slider holding portion 31 for fixing a head slider (not shown) so as to extend from the area where the thin film piezoelectric element 8 is bonded. The slider holding portion 31 is provided with a head electrode pad 32 for connecting the wiring section of a head (not shown) mounted on a head slider (not shown). From the head electrode pad 32, head electrode wiring 33 is led and arranged on the flexure 30 between the thin film piezoelectric elements 8 up to a connecting pad (not shown) for connection to external equipment in the same way as for piezoelectric electrode wiring 35 led from the piezoelectric electrode pad 34.

Figure 2:
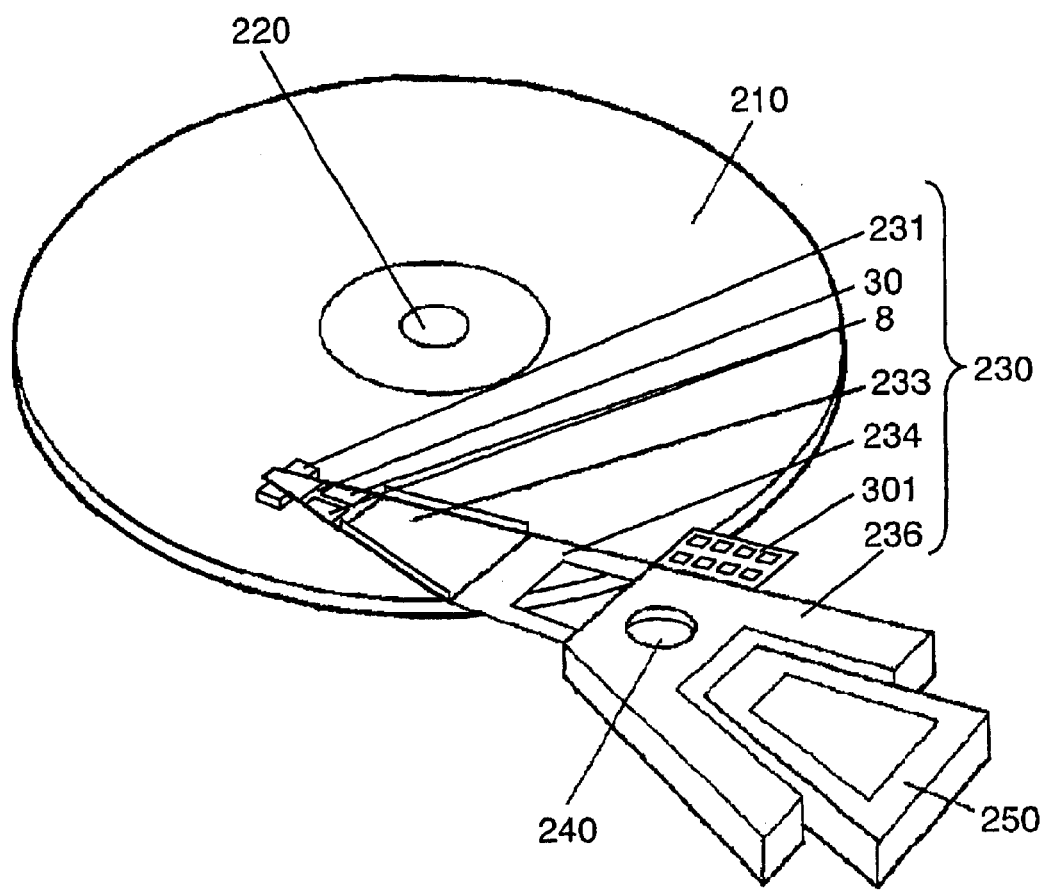
FIG. 2 is a schematic diagram of a disk unit using an actuator unit equipped with thin film piezoelectric elements of the present invention.

FIG. 2 is a schematic diagram showing a state of a disk drive unit using the actuator unit of the present invention. Actuator unit 230 comprises a head slider 231 having a head (not shown) for recording and reproducing operation on disk 210, a pair of thin film piezoelectric elements 8, flexure 30, suspension 233, plate spring 234, and supporting arm 236. The suspension 233, plate spring 234, and supporting arm 236 make up an actuator arm. Also, at the flexure 30, the head electrode wiring 33 and the piezoelectric electrode wiring 35 are extended from the head electrode pad 32 of slider holding portion 31 and the piezoelectric electrode pad 34 of thin film piezoelectric element 8 to the positions close to the supporting arm 236, and there is provided a connecting pad 301 for connection to external equipment.

The head slider 231 is supported by the flexure 30, and a head (not shown) is mounted on a surface opposite to the disk 210. The paired thin film piezoelectric elements 8 are bonded on the flexure 30 adjacent to the head slider 231.

One end of the flexure 30 is held on the suspension 233 that is a part of the actuator arm, and the suspension 233 is fixed to the plate spring 234. Further, the plate spring 234 is fixed to the supporting arm 236.

The supporting arm 236 is journaled on bearing 240 and freely rotatable. Also, the supporting arm 236 is provided with a voice coil 250 which makes up a VCM for rotating the supporting arm 236. The VCM is fabricated by the voice coil 250 and a magnet (not shown) fixed in a casing (not shown). Accordingly, the actuator unit 230 is capable of two-step positioning, that is, positioning by VCM and positioning by paired thin film piezoelectric elements 8.

The operation of the disk drive unit using the actuator unit 230 will be described in the following. When the disk 210 is rotated by spindle motor 220, air flows in between the head slider 231 and the disk 210, thereby forming an air bearing film. The head slider 231 is in a state of stable flying at the position where the air bearing film is balanced with the pressing force from the plate spring 234. The flying height ranges from about 10 nm to 50 nm. In such state of flying, the head is positioned to the specified position of disk 210, and therefore, the supporting arm 236 is rotated by VCM. In the case of an ordinary disk drive unit, positioning to a specified track position can be done only by the VCM. However, to minimize the track pitch for recording at a higher density, it is necessary to execute the positioning with greater accuracy. The purpose may be achieved by using the paired thin film piezoelectric elements 8. The paired thin film piezoelectric elements 8 are disposed close to the head slider 231 of the flexure 30, and by driving the thin film piezoelectric elements 8, the head position can be freely moved about several μm in the direction radial to the disk 210 irrespective of the suspension 233 and the supporting arm 236. That is, when a voltage is applied in such direction as to cause one of the paired thin film piezoelectric elements 8 to extend and the other to contract, the head can be moved about several μm in a direction radial (in the Y—Y direction shown in FIG. 1) to the disk 210.

By the above operation, it is possible to execute the two-step positioning, that is, positioning by VCM and highly accurate positioning by thin film piezoelectric elements 8. This actuator unit 230 is just an example, and it is not limited to the present preferred embodiment with respect to the structure of the actuator in particular.

A manufacturing method for such thin film piezoelectric elements 8 will be described by using FIG. 3A to FIG. 5.

Figure 3A:
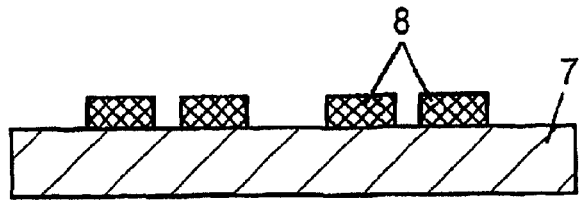
FIG. 3A shows a state of many paired thin film piezoelectric elements formed on an element forming substrate in a step out of the main steps in the manufacturing method in the first preferred embodiment of the present invention.
Figure 5:
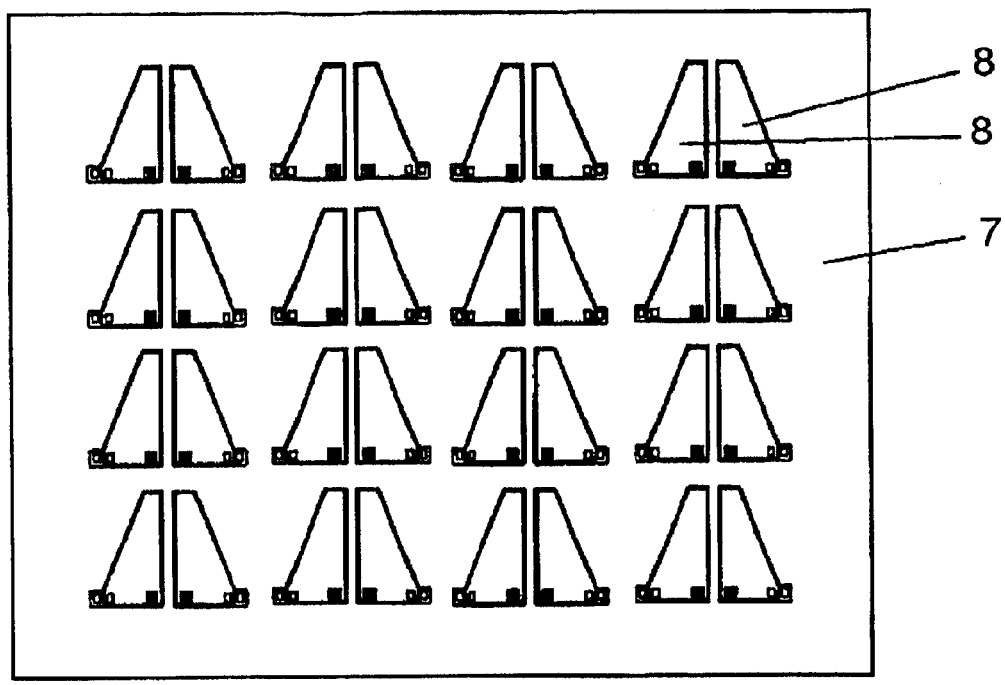
FIG. 5 shows a state of forming a plurality of thin film piezoelectric elements on an element forming substrate in a step out of the main steps in the manufacturing method in the preferred embodiment.

FIG. 3A shows a state of a plurality of paired thin film piezoelectric elements 8 formed on the element forming substrate 7. Only two pairs of thin film piezoelectric elements 8 are shown in FIG. 3A. Specifically, however, as shown in FIG. 5, a number of thin film piezoelectric elements 8 are formed on the element forming substrate 7 in the form of specific arrangement. As the element forming substrate 7, it is possible to use metallic materials such as stainless steel and the like as well as MgO substrate, Si substrate, sapphire substrate or mono-crystalline substrates such as lead zirconate titanate mono-crystalline substrate.

The manufacturing method for thin film piezoelectric elements 8 is described below. The two-layer laminate on the element forming substrate 7 can be obtained by such method that a first electrode layer 11, piezoelectric layer 12, and second electrode layer 13 are bonded on a substrate same as the element forming substrate 7, then the substrate and the element forming substrate are bonded opposite to each other by adhesive layer 14, and one of the substrates is removed by etching, followed by processing it into the shape as shown in FIG. 1A by photolithography and etching. At the time, a via-hole is also formed so that a part of the second electrode layer 13 is exposed. After that, insulating layer 15 is formed and processed by photolithography and etching so that a part of each electrode layer is exposed, and further connecting electrode layer 16 is formed and processed into the shape as shown in FIG. 1A and FIG. 1B, and thereby, the thin film piezoelectric elements 8 can be manufactured.

As the insulating layer 15, it is preferable to use an organic resin layer like polyimide or an inorganic insulating layer such as silicon oxide layer. As a layer forming method, it is preferable to employ any of chemical and physical film forming methods such as an application method, a plasma chemical vapor phase reaction method or a method of film forming by sputtering.

Figure 3B:
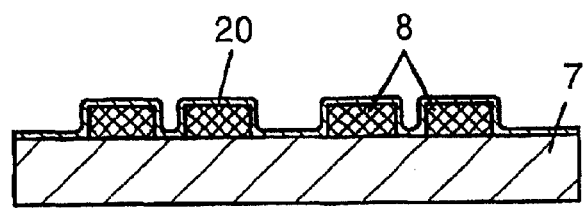
FIG. 3B shows a state of an element holding layer formed in a step out of the main steps in the manufacturing method in the preferred embodiment.
Figure 3C:
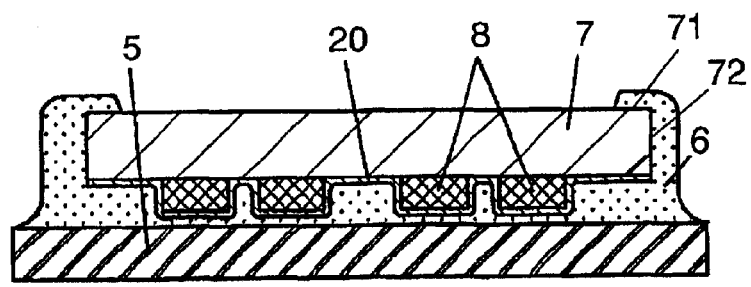
FIG. 3C shows a state of protecting the area, not subjected to etching, by a temporary fixing substrate and fixing resin in a step out of the main steps in the manufacturing method in the preferred embodiment.

Thus, on the surface where the thin film piezoelectric elements 8 are formed, element holding layer 20 made up of resin is formed as shown in FIG. 3B. The element holding layer 20 is required to be a flexible material which will not crack even when shocks are given thereto, and also to be formed in relatively uniform thickness even on irregular surfaces including the thin film piezoelectric elements 8. For example, it is preferable to use a polyimide layer formed by imidizing at a temperature of about 350° C. after spin-coating and drying polyamide resin or to use a BCB layer formed by applying and heat curing organic resin such as benzocyclobutane (BCB). Further, as the element holding layer 20, it is possible to use a photo resist material generally used, or a photosensitive insulating resin material that may endure the temperature applied in the later process. As a method for forming the element holding layer 20, it is possible to use a spray method or roll-coating method as well as a spin-coating method.

Also, it is preferable to form a polyimide layer or BCB layer, for example, to obtain the element holding layer 20, according to a polymer layer forming system in which monomer is evaporated to produce polymerization reaction in plasma. By using this method, the layer can be uniformly formed on any place without increase in thickness on depressed surfaces and decrease in thickness on projected surfaces that may often take place in application of a liquid resin material, and thereby, it is possible to obtain the element forming substrate 20 which is thin and stable in strength. Specifically, a polyimide layer can be obtained by evaporating two or more kinds of monomer to produce polymerization reaction on a substrate, or an organic resin layer such as polyimide and benzocyclobutane (BCB) can be manufactured by evaporating polymer to produce polymerization reaction in plasma. Regarding the thickness of the element holding layer 20, it is desirable to be as thin as possible provided that the strength is enough to hold a plurality of thin film piezoelectric elements 8, and in the case of polyimide resin layer, the thickness is preferably about 2 to 5 μm.

Electrode pad 18 is formed by removing a part of the element holding layer 20 formed in the area of connecting electrode layer 16 by means of photolithography and etching. Thus, a shape covered with the element holding layer except the electrode pad 18 can be obtained. After processing the element holding layer 20 as described above, as shown in FIG. 3C, temporary fixing substrate 5 is opposed to the surface where the element holding layer 20 is formed and is secured by fixing resin 6. Further, the surfaces, ranging from the peripheral portion of the surface, where the thin film piezoelectric elements 8 are not formed, of the element forming substrate 7 to the peripheral area 71 and the peripheral end portion 72 of the element forming substrate 7 with a specified width, are covered and protected by using similar fixing resin 6 as illustrated. As the fixing substrate 5, for example, glass, ceramic such as alumina, or a metal sheet plated with chrome or the like that is not corroded by phosphoric acid based chemical solution may be used. Also, as the fixing resin 6, for example, it is preferable to use wax or photo resist.

Figure 3D:
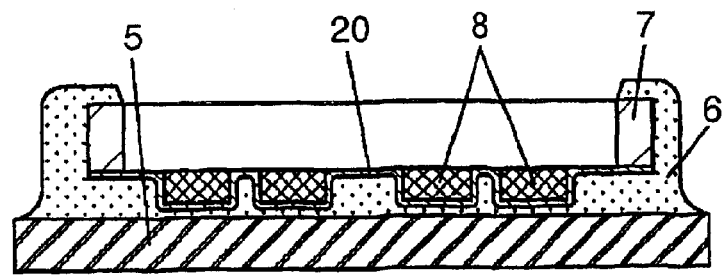
FIG. 3D shows a state after etching and removing the element forming substrate except the peripheral portion in a step out of the main steps in the manufacturing method in the preferred embodiment.

After making it into such a shape, only the element forming substrate 7 is completely immersed into a chemical solution for selective etching in order to remove the element forming substrate 7 not protected by the fixing resin 6. For example, when an MgO substrate is used as the element forming substrate 7, only the MgO substrate can be selectively etched without corrosion of other materials by using phosphoric acid type chemical solution. Also, when an Si substrate is used as the element forming substrate 7, it is possible to similarly perform selective etching by using a mixed solution of hydrofluoric acid and nitric acid. Also, it is preferable to remove the substrate by dry etching. As a result, as shown in FIG. 3D, the element forming substrate 7 changes into a frame-like shape, and thereby, a shape with the first electrode layer (not shown) of the element forming substrate 7 exposed can be obtained.

Figure 4A:
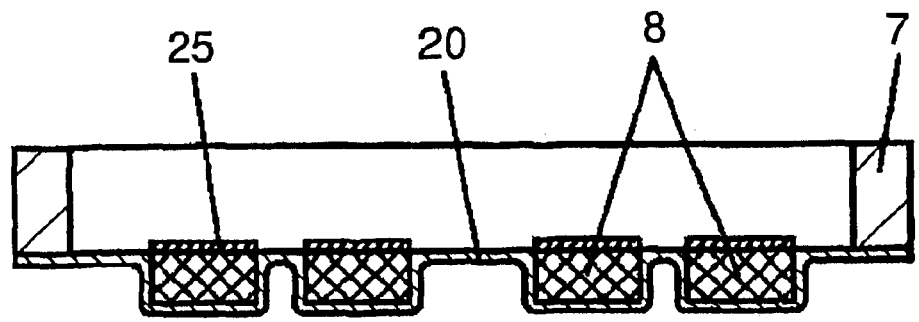
FIG. 4A shows a state of thin film piezoelectric elements held by the peripheral frame of element forming substrate and an element holding layer in a step out of the main steps in the manufacturing method in the preferred embodiment.

By using a substrate thus prepared, adhesive resin layer 25 is formed on a first electrode layer (not shown). After that, the substrate is immersed into a solution for dissolving the fixing resin 6. With the fixing resin 6 dissolved and the temporary fixing substrate 5 removed, a structure such that the thin film piezoelectric elements 8 covered with the adhesive resin layer 25 are held only by the peripheral frame portion of element forming substrate 7 and element holding layer 20 can be obtained. It is shown in FIG. 4A.

It is preferable to form the adhesive resin layer 25 after dissolving the fixing resin 6 and removing the temporary fixing substrate 5. Also, it is preferable to form the adhesive resin layer 25 on the surface of flexure 30. The adhesive resin layer 25 can be easily formed on the first electrode layer surface, for example, by applying a photosensitive material, being adhesive under heat and pressure, over the entire surface thereof, followed by photolithography and etching. Also, it is preferable to make the adhesive resin layer 25 by affixing a sheet of adhesive resin on the first electrode layer after processing the sheet into same shape as that of the thin film piezoelectric elements 8. Or, it is also possible to prepare the adhesive resin layer 25 by directly applying adhesive resin only onto the first electrode layer surface by means of an ink jet system.

Figure 4B:
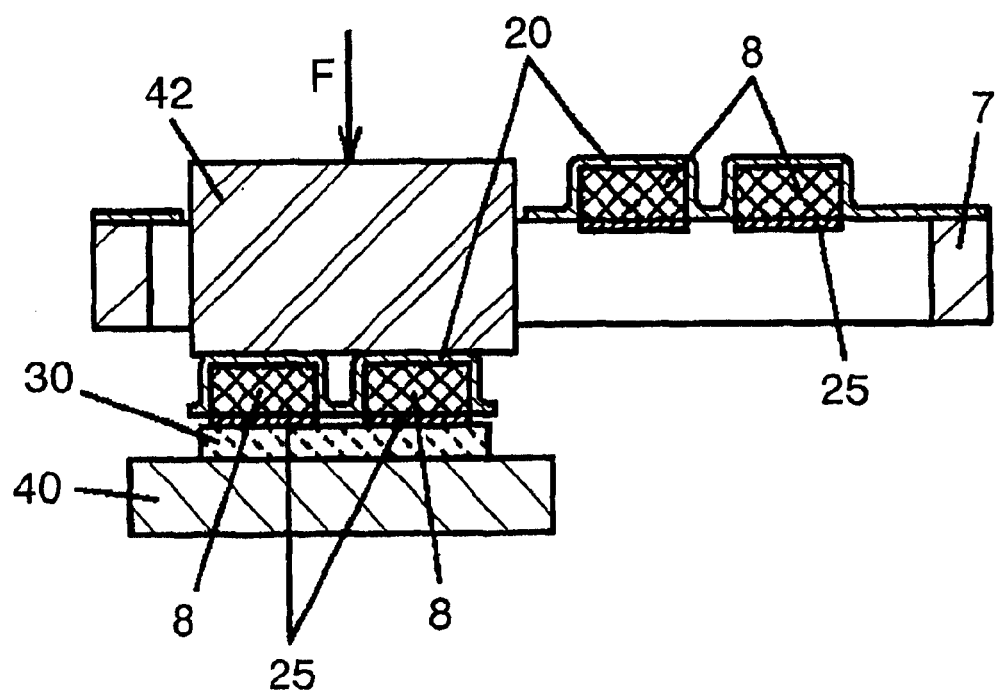
FIG. 4B shows a method of mounting thin film piezoelectric elements on a mounting substrate in a step out of the main steps in the manufacturing method in the preferred embodiment.

After forming the adhesive resin layer 25, as shown in FIG. 4B, the flexure 30 placed on base 40 is positioned with respect to the thin film piezoelectric elements 8, and while cutting off the element holding layers 20 at the peripheral portion of the thin film piezoelectric elements 8 by applying a load F to a pressing tool 42, the thin film piezoelectric elements 8 are bonded and secured on the flexure 30 under heat and pressure. After completing the bonding, the pressing tool 42 is removed from the thin film piezoelectric elements 8. After that, the electrode pad 18 is connected to the piezoelectric electrode pad 34 with wire lead 37 by a method such as a wire bonding method, and then, the thin film piezoelectric elements 8 mounted on the flexure 30 as shown in FIG. 1A can be obtained. That is, in the manufacturing method in the present preferred embodiment, the thin film piezoelectric elements 8 mounted on the flexure 30 are configured such that the insulating layer 15 and the element holding layer 20 made up of resin are formed on the side where the electrode pad 18 is formed and only the adhesive resin layer 25 is formed on the opposite side. Thus, since the thin film piezoelectric elements 8 are paired, it is possible to obtain great displacement in use of the elements as an actuator unit. Also, since neighboring thin film piezoelectric elements are used in pairs, it is possible to reduce the variation in characteristics of these thin film piezoelectric elements and to assure stable operation as an actuator unit.

By this manufacturing method, even with the element forming substrate 7 removed by etching, the thin film piezoelectric elements 8 can maintain the initial arrangement as shown in FIG. 5 due to the peripheral frame of element forming substrate 7 and the element holding layer 20. Accordingly, the steps of forming the adhesive resin layer 25 for mounting the thin film piezoelectric elements 8 on the flexure 30 as a mounting substrate, positioning, and bonding under heat and pressure can be precisely and simply executed. As a result, the productivity of thin film piezoelectric elements 8 will be greatly improved.

Second Exemplary Embodiment

Figure 6A:
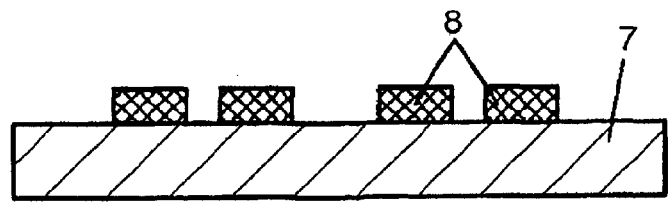
FIG. 6A shows a state of many paired thin film piezoelectric elements formed on an element forming substrate in a step out of the main steps in the manufacturing method in the second preferred embodiment of the present invention.
Figure 6B:
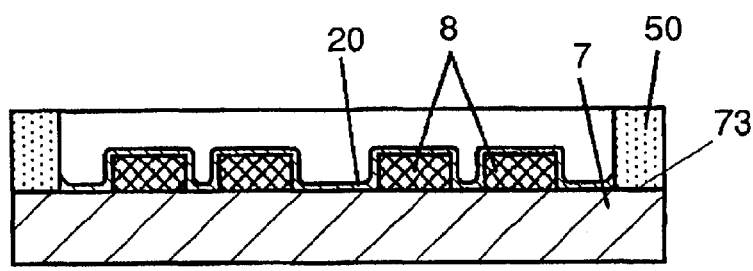
FIG. 6B shows a state of a frame fixed and an element holding layer formed in a step out of the main steps in the manufacturing method in the referred embodiment.

FIG. 6A to FIG. 6D are diagrams for describing the manufacturing steps in the manufacturing method in the second preferred embodiment. FIG. 6A shows a state of the element forming substrate 7 on which the thin film piezoelectric elements 8 shown in FIG. 1A are formed the same as in FIG. 3A. By using a substrate thus prepared, as shown in FIG. 6B, a frame 50 is fixed by using adhesive at the periphery of element forming substrate 7 and in area 73 where the thin film piezoelectric elements 8 are not formed. As the frame 50, it is preferable to use a material that is not corroded by the solution or gas used for removing the element forming substrate 7. For example, it is possible to use a material prepared by processing metal such as stainless steel, glass, ceramic, like alumina, or plastic such as liquid crystal polymer. Since these materials can be freely selected, it is easy, for example, to provide the surface of the frame fixed on the element forming substrate with difference in level. Provided with difference in level, the entire width of the frame can be increased while decreasing the width of the frame to be fixed on the element forming substrate. Accordingly, it is possible to decrease the width of the frame to be fixed on the element forming substrate and to form more thin film piezoelectric elements on the element forming substrate while assuring sufficient strength as a frame.

After fixing the frame 50 on the element forming substrate 7, the element holding layer 20 made up of resin is formed over the entire surfaces including the frame 50, thin film piezoelectric elements 8, and the plane surface of the element forming substrate 7 where these elements are formed. The element holding layer 20 can be formed by using the same material and method described in the first preferred embodiment.

After forming the element holding layer 20, it is entirely immersed in a solution for etching only the element forming substrate 7 in order to completely remove the element forming substrate 7 by etching, and then, a shape with thin film piezoelectric elements 8 held only by the element holding layer 20 and the frame 50 can be obtained. For removing the element forming substrate 7, besides the method of using a solution for etching, it is possible to use a method of dry etching, and also preferable to execute wet etching or dry etching after a step of thinning by mechanical polishing.

Figure 6C:
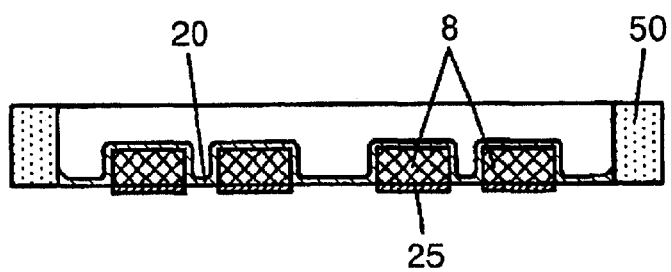
FIG. 6C shows a state of a adhesive resin layer formed on thin film piezoelectric element exposed by etching the element forming substrate in a step out of the main steps in the manufacturing method in the preferred embodiment.

In this condition, adhesive resin is applied onto the first electrode layer (not shown) of the thin film piezoelectric elements 8 exposed by etching, thereby forming the adhesive resin layer 25. The adhesive resin layer 25 may also be formed by using the same material and method as in the first preferred embodiment. A state of the adhesive resin layer 25 formed on the thin film piezoelectric element 8 is shown in FIG. 6C.

Figure 6D:
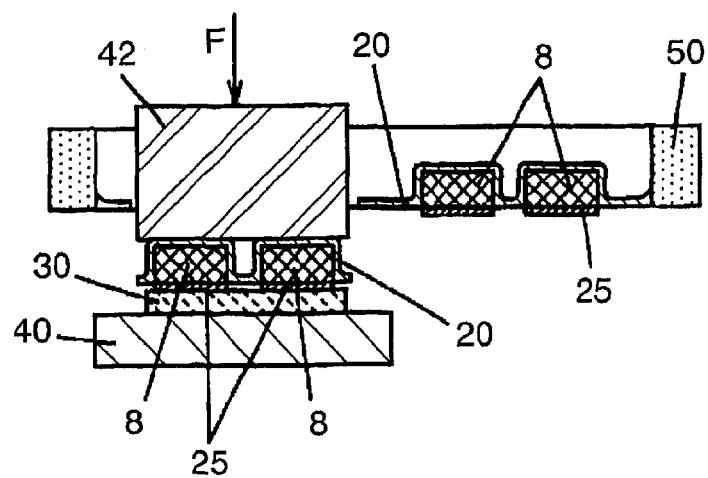
FIG. 6D shows a method of mounting thin film piezoelectric elements on a mounting substrate in a step out of the main steps in the manufacturing method in the preferred embodiment.

Next, the flexure 30 as a mounting substrate is placed on the base 40, and after positioning the thin film piezoelectric elements 8 with respect to the flexure 30, the thin film piezoelectric elements 8 may be bonded and secured on the flexure 30 by heating while applying load F by the pressing tool 42. It is shown in FIG. 6D. After the pressing tool 42 is removed, the electrode pad 18 of the thin film piezoelectric element 8 is further connected to the piezoelectric electrode pad 34 of the flexure 30 by using wire lead 37 according to a wire bonding method, and thereby, a configuration with the thin film piezoelectric elements 8 mounted on the flexure 30 may be obtained as shown in FIG. 1A.

The element forming substrate 7 generally used for forming piezoelectric thin film is made up of MgO substrate, Si substrate or the like, but these materials are fragile and liable to break when the peripheral frame portion is formed by etching in frame-like shape. However, in the case of frame 50 used in the present preferred embodiment, a separate substrate different from the element forming substrate 7 can be used, and it is possible to freely select a strong material like metal. Therefore, there is no fear of breakage of the substrate at the time of forming the adhesive resin layer 25 or mounting it onto the flexure 30, and the reduction of the yield in these steps can be prevented.

Figure 7:
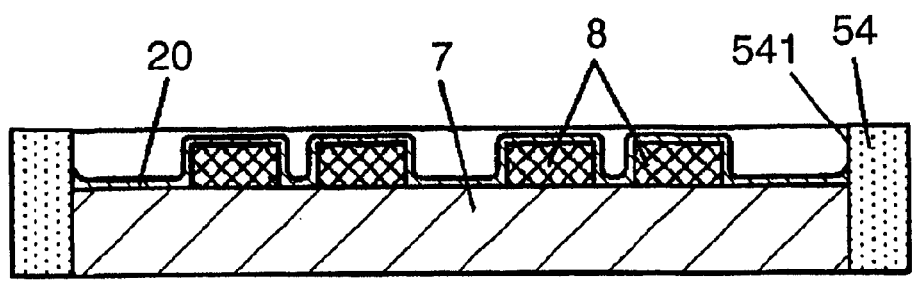
FIG. 7 shows a transformational example of main process in the manufacturing method in the preferred embodiment.

In the present preferred embodiment, the frame 50 is fixed at the peripheral portion on the element forming substrate 7, but the manufacturing method in the present preferred embodiment is not limited to this. For example, as shown in FIG. 7, it is preferable to fit the frame 54 so as to be contacted on the periphery of the element forming substrate 7, and to coat the thin film piezoelectric elements 8, side portion 541 of frame 54, and electrode forming substrate 7 with element holding layer 20. By this configuration, it is possible to use the element forming substrate 7 in as much area as possible, and at the same time, to increase the number of thin film piezoelectric elements 8 manufactured, thereby improving the productivity. When the frame 54 is fitted to the element forming substrate 7, it is desirable to make the surface of thin film piezoelectric element 8 nearly flush with the surface of frame 54. However, the surface of frame 54 is not always required to be flush with the surface of thin film piezoelectric element 8 provided that it is possible to execute the steps of coating the adhesive resin layer 25 and forming the insulating layer 15 after fitting the frame and the substrate or to perform photolithography and etching for processing them into specified pattern shapes.

In the first and second preferred embodiments, the element holding layer 20 remains as it is even after the thin film piezoelectric elements 8 are mounted on the flexure 30, and it is used an a protective layer, but the present invention is not limited to this configuration. As the element holding layer 20, it is just required to hold the thin film piezoelectric elements 8 after the element forming substrate 7 has been removed by etching. Therefore, it is preferable to form the layer on only a part of the thin film piezoelectric elements 8 so that only the part will remain after the elements are mounted on the flexure. For example, it is preferable to form the element holding layer 20 only in the area of thin film piezoelectric elements 8 provided with the electrode pad 18. That is, it is not necessary to hold the thin film piezoelectric elements 8 by using the entire surface of the element holding layer 20, but partial holding is just enough provided that the elements are precisely held. To obtain a shape that enables such partial holding, it is preferable to remove unessential portions by photolithography and etching after forming the layer over the entire surfaces and also to form the layer only on specified portions by means of printing or ink jet system and the like.

Third Exemplary Embodiment

Figure 8A:
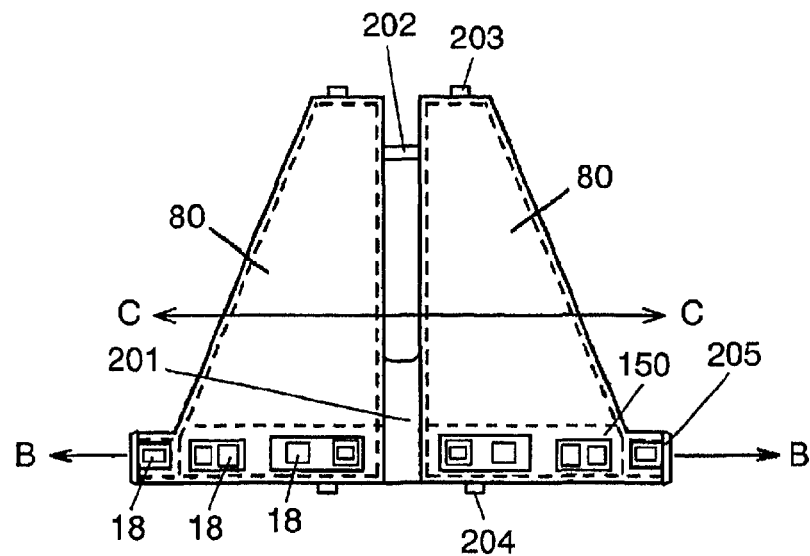
FIG. 8A is a plan view of paired thin film piezoelectric elements made by the manufacturing method in the third preferred embodiment of the present invention.
Figure 8B:
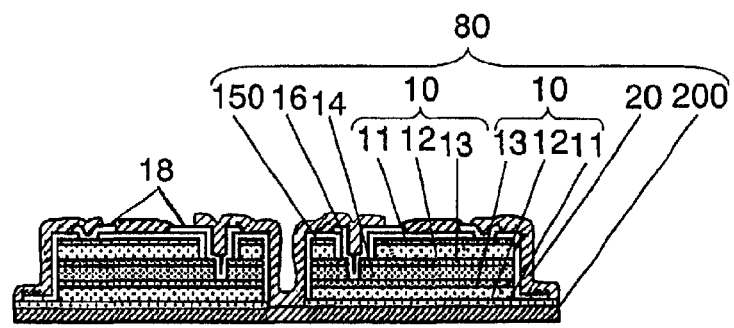
FIG. 8B is a sectional view along the B—B line shown in FIG. 8A.
Figure 8C:
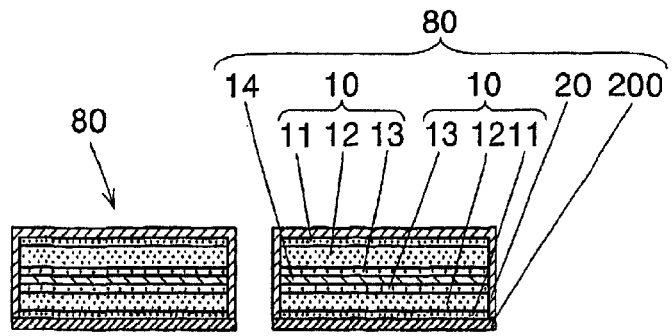
FIG. 8C is a sectional view along the C—C line shown in FIG. 8A.

FIG. 8A is a plan view of thin film piezoelectric elements used in an actuator unit as a pair of thin piezoelectric elements made by the manufacturing method in the third preferred embodiment. FIG. 8B is a sectional view along the B—B line shown in FIG. 8A, and FIG. 8C is a sectional view along the C—C line of FIG. 8A. The paired thin film piezoelectric elements can be used in a disk drive unit shown in FIG. 2 the same as in the first preferred embodiment.

The thin film piezoelectric element 80 in the present preferred embodiment uses a two-layer laminate in that two laminates 10 respectively made up of piezoelectric thin film 12 held between first electrode layer 11 and second electrode layer 13 are integrally laminated by bonding the second electrode layers 13 to each other by adhesive layer 14. The structure and shape of the two-layer laminate are same as those of the thin film piezoelectric elements 8 in the first preferred embodiment.

The thin film piezoelectric elements 80 in the present preferred embodiment are different from the thin film piezoelectric elements 8 in the first preferred embodiment with respect to the following points. Firstly, insulating layer 150 is formed only in the area of connecting electrode layer 16 for connecting the first electrode layer 11 and the second electrode layer 13 to external equipment. As shown in FIG. 8A to FIG. 8C, the insulating layer 150 is formed in the area where the connecting electrode layer 16 is formed, but it is not formed in the other area. Secondly, the element holding layer 20 made up of resin, and protective resin layer 200 same in material and thickness as the element holding layer 20 are formed in the area that functions as piezoelectric material. The area that functions as piezoelectric material is the area other than the area where the connecting electrode layer 16 of the thin film piezoelectric element is formed. Thirdly, element connecting portions 201, 202 made up of element holding layer 20 and protective resin layer 200 are formed in the gapped portion near the area where the connecting electrode layer 16 of thin film piezoelectric element 80 is formed and in the gapped portion near the end thereof, thereby establishing the connection between the thin film piezoelectric elements 80. Fourthly, holding connections 203, 204, 205 made up of element holding layer 20 and protective resin layer 200 are cut off after mounting the elements, letting some of them remain there.

The manufacturing method for such thin film piezoelectric elements 80 will be described in the following mainly referring to the steps that differ from those in the first preferred embodiment. A two-layer laminate as described in the first preferred embodiment is processed into a rectangular shape right-angled at one side as shown in FIG. 8A. The step is same as in the first preferred embodiment. After that, insulating layer 150 is formed and subjected to etching process so that the insulating layer 150 is formed only in the area where the connecting electrode layer 16 is formed. Further, the connecting electrode layer 16 for connecting the first electrode layer 11 and the second electrode layer 13 to external equipment is processed into a shape as shown in FIG. 8A and FIG. 8B.

Figure 9:
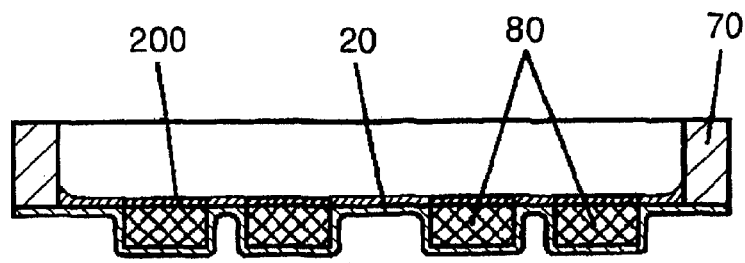
FIG. 9 shows a state of a protective resin layer formed in a step out of the main steps in the manufacturing method in the preferred embodiment.

After obtaining the shape, element holding layer 20 made up of resin is formed over the entire surfaces the same as in the first preferred embodiment, and a temporary fixing substrate is bonded thereto by using fixing resin. Subsequently, the element forming substrate 7 in the area where thin film piezoelectric elements 80 are formed is removed by etching, and then the fixing resin is dissolved, and thereby, a structure that is held by the peripheral frame of element forming substrate 7 and the element holding layer 20 can be obtained. These steps are same as those in the first preferred embodiment. After that, protective resin layer 200 is formed over the entire surface of the element forming substrate including the first electrode layer 11 exposed by etching the element forming substrate 7 by a method same in material and thickness as for the element holding layer 20. It is shown in FIG. 9.

Figure 10A:
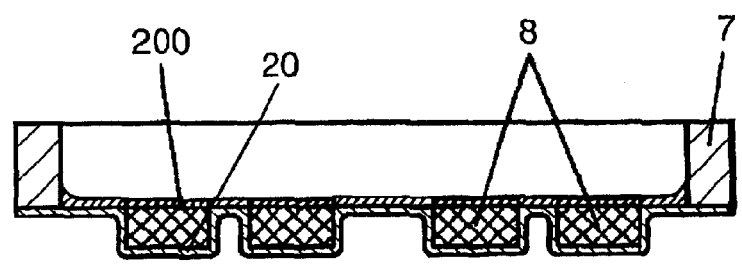
FIG. 10A shows a state of an element holding layer and protective resin layer etched for partly forming a connection, showing the sectional shape of same portion as that of FIG. 8B, in a step out of the main steps in the manufacturing method in the preferred embodiment of the present invention.
Figure 10B:
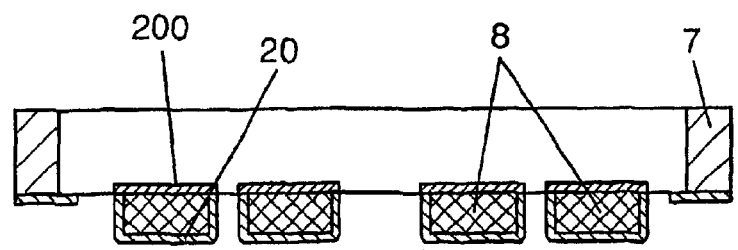
FIG. 10B shows a state of an element holding layer and protective resin layer etched for partly forming a connection, showing the sectional shape of same portion as that of FIG. 8C, in a step out of the main steps in the manufacturing method in the preferred embodiment of the present invention.
Figure 11:
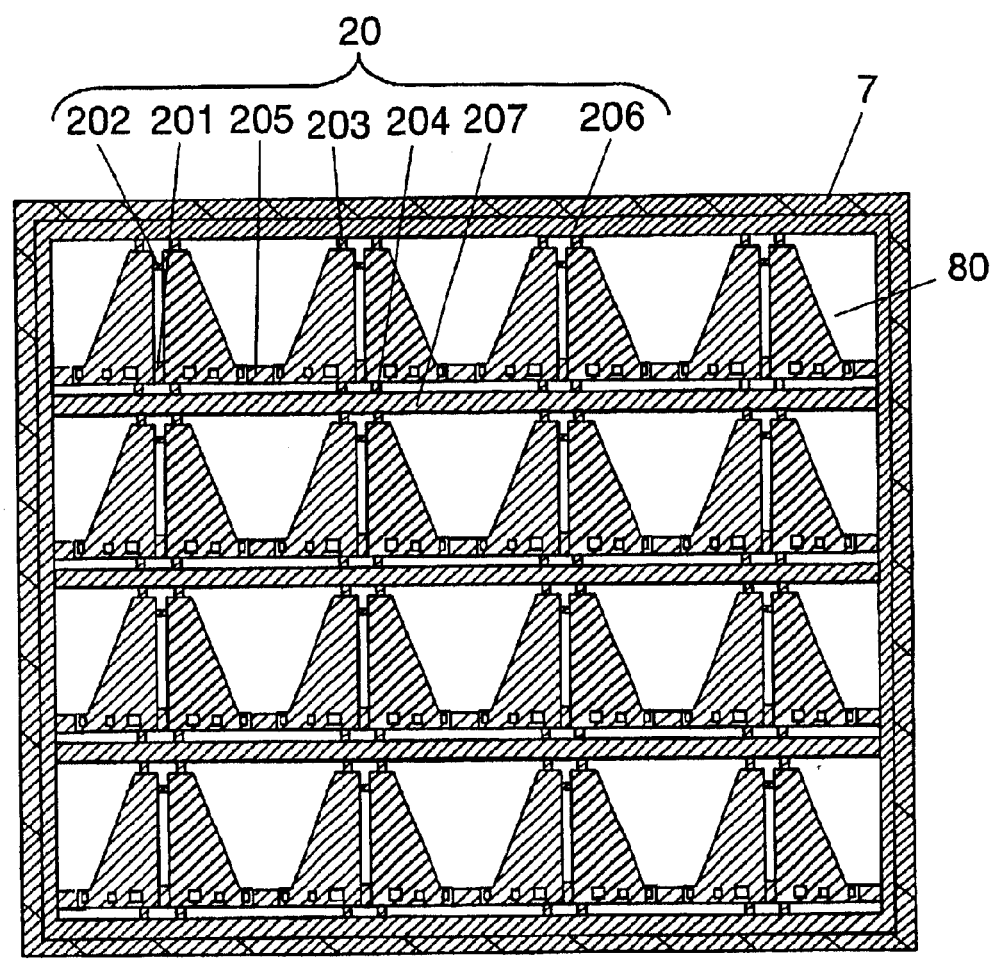
FIG. 11 is a plan view showing a state of an element holding layer and protective resin layer etched for partly forming a connection in a step out of the main steps in the manufacturing method in the preferred embodiment of the present invention.

After forming the element holding layer 20 and protective resin layer 200, the element connecting portions 201, 202 for connection between the paired thin film piezoelectric elements 80, and the holding connections 203, 204, 205 for holding the thin film piezoelectric elements 80 by the element holding layer 20 and protective resin layer 200 are formed. The process can be executed by ordinary photolithography and etching just to remove the element holding layer 20 and protective resin layer 200 which are unessential. In this case, the same etching solution can be used for etching because these layers are same in material. During the process, the electrode pad 18 is also formed by etching a part of the element holding layer 20 on the connecting electrode layer 16. The states of the elements after finishing the process are shown in FIG. 1A, FIG. 10B and FIG. 11. FIG. 10A is a sectional view same as in FIG. 8B, and FIG. 10B shows a sectional view same as in FIG. 8C. Also, FIG. 11 is a plan view showing a state of a plurality of thin film piezoelectric elements connected by the peripheral frame of the element forming substrate 7 and the element holding layer 20.

Due to the shape thus formed, there is no fear of accidentally causing damage to the thin film piezoelectric elements 80 by the pressing tool 42 since cutting off only the holding connections 203, 204, 205 by punching them with the pressing tool 42 is just enough when mounting the elements on the flexure 30 that is a mounting substrate. Also, in the area that functions as a piezoelectric material, a layer made up of resin, same in material and thickness, is formed on each of the surfaces, and therefore, these layers serve to cancel the warp of thin film piezoelectric elements 80, hardly causing the deterioration of the piezoelectric characteristics.

In the present preferred embodiment, the adhesive resin layer 25 for bonding the thin film piezoelectric elements 80 onto the flexure 30 is better to be formed on the flexure 30 side from the workability point of view. However, it is not limited to the flexure 30 side, and for example, it is possible to form the layer on the thin film piezoelectric element 80 side by means of an ink jet system or the like.

Fourth Exemplary Embodiment

FIG. 12 is a process chart showing the manufacturing method in the fourth preferred embodiment of the present invention. FIG. 12A is the same configuration as described in the manufacturing method in the first preferred embodiment, showing a state of the thin film piezoelectric elements 8 formed on the element forming substrate 7.

Flexible substrate 56 having adhesive surface is pressed against the surface of the element forming substrate 7 where the thin film piezoelectric elements 8 are formed, thereby bonding the flexible substrate 56 thereon. In this case, the flexible substrate 56 is liable to bend and wrinkle, and to prevent this, it is desirable to fix a frame 52 to the flexible substrate 56 in order to apply tension to the flexible substrate 56 before bonding. A state of the flexible substrate bonded in this way is shown in FIG. 12B.

Figure 12A:
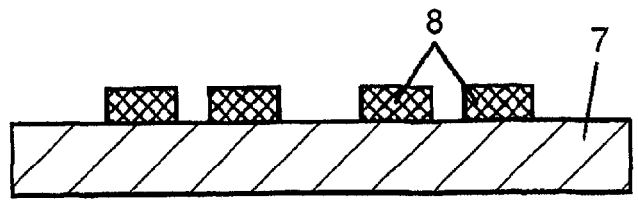
FIG. 12A shows a state of many paired thin film piezoelectric elements formed on an element forming substrate in a step out of the main steps in the manufacturing method in the fourth preferred embodiment of the present invention.
Figure 12B:
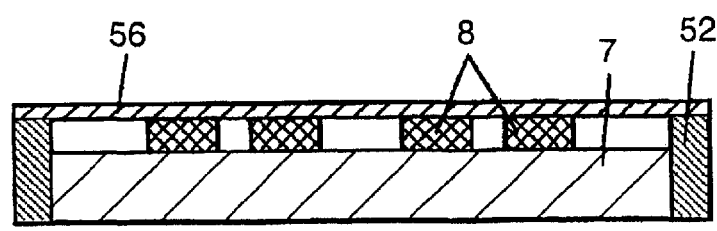
FIG. 12B shows a state of thin film piezoelectric elements bonded and secured by using a flexible substrate having a frame around it a step out of the main steps in the manufacturing method in the referred embodiment.

In FIG. 12B, the frame 52 is fitted in the element forming substrate 7, but this state of fitting is not essential in the manufacturing method in the present preferred embodiment, and including some clearance therein does not cause any particular problems. That is, a plurality of thin film piezoelectric elements 8 are bonded to the flexible substrate 56, and the flexible substrate 56 is great in strength, and therefore, it is not always necessary to hold the element forming substrate 7 by the frame 52.

Figure 12C:
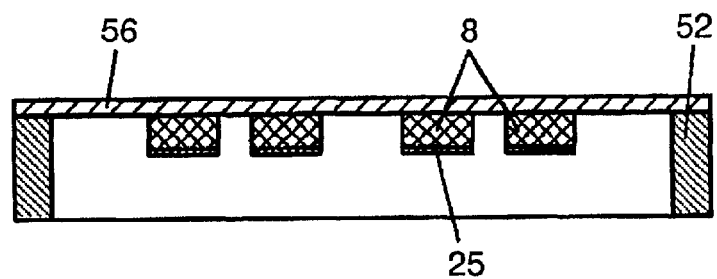
FIG. 12C shows a state of a adhesive resin layer formed on thin film piezoelectric elements exposed by etching the element forming substrate in a step out of the main steps in the manufacturing method in the preferred embodiment.

In this condition, only the element forming substrate 7 is entirely immersed in the etching solution to remove the element forming substrate 7 by etching, and adhesive resin is applied to the surface of first electrode layer (not shown) of the thin film piezoelectric element 8 then exposed, thereby forming an adhesive resin layer 25. It is shown in FIG. 12C. The adhesive resin layer 25 may also be formed by using the material and method described in the manufacturing method in the first preferred embodiment.

Figure 12D:
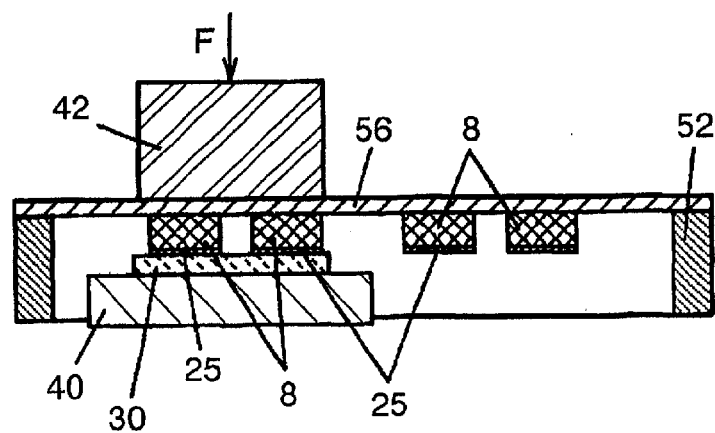
FIG. 12D shows a method of mounting thin film piezoelectric elements on a mounting substrate in a step out of the main steps in the manufacturing method in the preferred embodiment.

Next, as shown in FIG. 12D, the flexure 30 placed on the base 40 is positioned with respect to the thin film piezoelectric elements 8, followed by applying a pressure to the pressing tool 42 and heating, then the thin film piezoelectric elements 8 are bonded and secured on the flexure 30. In this case, if the adhesive layer formed on the flexible substrate 56 has a nature of becoming less adhesive due to ultraviolet application, then the mounting process will be further simplified. That is, by applying a pressure to the pressing tool 42 and heating, and applying ultraviolet ray at the same time, the thin film piezoelectric elements 8 can be easily and precisely removed from the flexible substrate 56. For example, as such flexible substrate 56, it is also possible to use adhesive film or the like used for dicing semiconductors.

Further, in such a state that only the thin film piezoelectric elements 8 held on the flexible substrate 56, removing the element forming substrate 7, it is possible to use a flexible substrate capable of widening the space between the thin film piezoelectric elements 8 by uniformly expanding the flexible substrate 56 from the peripheral portion thereof. By using such a flexible substrate, the workability of the pressing tool can be improved when bonding the thin film piezoelectric elements 8 onto the mounting substrate 30.

Figure 12E:
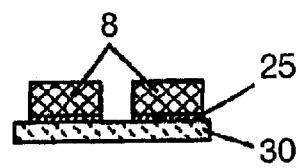
FIG. 12E shows a state of thin film piezoelectric elements mounted on a mounting substrate by the manufacturing method in the preferred embodiment.

A state of the thin film piezoelectric elements 8 thus bonded and secured on the flexure 30 is shown in FIG. 12E. In this fourth preferred embodiment, no element holding layer is needed unlike in the manufacturing method in the first and second preferred embodiments, and therefore, the layer forming and patterning steps can be omitted. Also, the thin film piezoelectric elements 8 after removing the element forming substrate 7 by etching are held by the flexible substrate 56, and the flexible substrate 56 is about 50 μm in thickness, and therefore, the workability can be greatly improved.

In the first preferred embodiment to the fourth preferred embodiment, the manufacturing method has been described on an example of paired thin film piezoelectric elements, but the manufacturing method of the present invention is not limited to this configuration. It is also preferable to use only one thin film piezoelectric element. Further, a similar manufacturing method may be employed not only in the case of application as an actuator unit, but in the case of using thin film piezoelectric elements in a sensor or the like for measuring the amount of displacement.

Also, as thin film piezoelectric elements, a two-layer laminate of piezoelectric thin films held between the first electrode layer and the second electrode layer has been described, but the present invention is not limited to this configuration. It is possible to employ a similar manufacturing method even in the case of a single layer.

Also, in the first, second and fourth preferred embodiments, a step of directly forming an adhesive resin layer on the first electrode layer of thin film piezoelectric element has been described, but the present invention is not limited to this. That is, it is also preferable to previously form an insulating protective layer before forming the adhesive resin layer, and to form the adhesive resin layer after forming the specified pattern. In this way, an insulating protective layer is formed over the thin film piezoelectric elements including the first electrode layer, and it is possible to improve the moisture resistance and to prevent more precisely the generation of dust or the like.

Further, within the scope of the present invention, it is possible to completely remove the element holding layer after mounting thin film piezoelectric elements on a flexure. That is, using thermoplastic adhesive, for example, as the resin material for forming the element holding layer, it is possible to dissolve and remove the thermoplastic adhesive by a solvent such as isopropanol after bonding the thin film piezoelectric elements on the flexure. By dissolving and removing the adhesive, it is possible to eliminate the electrode holding layer after mounting the elements. Also, for example, it is possible to use adhesive resin whose adhesive property is lowered under heat at 200° C. for one minute or over. With the element holding layer formed by using this adhesive resin, the element holding layer can be easily removed from the thin film piezoelectric elements as the element holding layer is lowered in adhesive property due to the heat applied for bonding the thin piezoelectric elements on the flexure. Further, it is preferable to form the element holding layer by using a material whose adhesive property is lowered by ultraviolet application and to treat the layer under heat and pressure while applying ultraviolet rays when mounting the elements, thereby removing the element holding layer from the thin film piezoelectric elements. In this way, with the element holding layer removed after the element mounting process, the step of forming an electrode pad by removing the element holding layer disposed on the connecting electrode layer of the thin film piezoelectric element becomes unnecessary, making it possible to reduce the man hour.

Also, in the present preferred embodiment, a case of bonding the thin film piezoelectric elements onto a mounting substrate has been described, but it is also preferable to separate the thin film piezoelectric elements in the form of individual pieces or a plurality of pieces gathered together and to use the thin film piezoelectric elements without bonding them on the mounting substrate.

Also, as a manufacturing method for piezoelectric elements of the present invention, it is also preferable to employ a method in that an element holding layer made up of resin is formed on one surface of an element forming substrate including thin film piezoelectric elements, and at the peripheral portion opposite to one surface of the element forming substrate, the area where thin film piezoelectric elements are not formed is shielded by a mask made up of a material as may not be etched in an atmosphere of etching the element forming substrate, and after that, the element forming substrate area not shielded by the mask is removed by dry etching, thereby holding the elements by the peripheral frame of the element forming substrate and the element holding layer. By employing such a method, it is possible to simplify the process because it is not necessary to use a temporary fixing substrate or fixing resin when executing selective etching that leaves the peripheral portion of the element forming substrate in the form of a frame.

For example, when MgO is used as an element forming substrate, it is preferable to use metal such as stainless steel, chrome, copper or chrome-plated copper, iron, etc., glass or ceramic, like alumina, as the mask material, and to execute dry etching after forming the material into a frame-like shape and bonding it on the element forming substrate. Also, it is possible to form a layer, for example, by spattering or the like, and to etch and remove only the layer on the surface of the element forming substrate to be etched, thereby leaving the other portion in the form of a frame to be used as a mask. For example, when Si substrate is used as an element forming substrate, it is preferable to form a layer of metal, like aluminum, or ceramic, like alumina, only on the peripheral frame of the Si substrate and to use it as a mask.

What is claimed is:

1. A manufacturing method for thin film piezoelectric elements, comprising:

forming a flat-plate laminate by sequentially laminating a first electrode layer, a piezoelectric thin film, and a second electrode layer, on one surface of an element forming substrate, and forming on said one surface of said element forming substrate a plurality of thin film piezoelectric elements comprising connecting electrodes for electrically connecting said first electrode layer and said second electrode layer to external equipment;

forming said element holding layer comprising resin over the one surface of said element forming substrate including said thin film piezoelectric elements;

bonding the one surface of said element forming substrate, opposed to a temporary fixing substrate and covered with said element holding layer, on said temporary fixing substrate by using a fixing resin;

covering a peripheral area with a specified width from a peripheral portion opposite to the one surface of said element forming substrate and a peripheral end portion of said element forming substrate with said fixing resin; and removing said element forming substrate by etching in an area other than the area covered with said fixing resin thereby holding said thin film piezoelectric elements by said element holding layer; and separating said thin film piezoelectric elements held by said element holding layer into individually separated elements or groups of elements.

2. The manufacturing method for thin film piezoelectric elements of claim 1, wherein forming said element holding layer comprises applying organic resin to said element forming substrate and thin film piezoelectric element surfaces, followed by dry hardening said element holding layer.

3. The manufacturing method for thin film piezoelectric elements of claim 1, wherein said element holding layer is formed by plasma polymerization reaction.

4. The manufacturing method for thin film piezoelectric elements of claim 1, wherein forming said element holding layer comprises spin coating of organic resin to said element forming substrate and thin film piezoelectric element surfaces.

5. The manufacturing method for thin film piezoelectric elements of claim 1, wherein the thickness of said element holding layer is substantially 2 to 5 $\mu$m.

6. The manufacturing method for thin film piezoelectric elements of claim 1, wherein forming the flat-plate laminate comprises forming a two-layer laminate comprising two assemblies, wherein second electrode layers of each of said assemblies face each other.

* * * * *